United States Patent
Yoon

(10) Patent No.: US 8,520,447 B2
(45) Date of Patent: Aug. 27, 2013

(54) SEMICONDUCTOR MEMORY DEVICE AND METHOD OF OPERATING THE SAME

(75) Inventor: Mi Sun Yoon, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 181 days.

(21) Appl. No.: 13/176,035

(22) Filed: Jul. 5, 2011

(65) Prior Publication Data

US 2012/0008429 A1 Jan. 12, 2012

(30) Foreign Application Priority Data

Jul. 9, 2010 (KR) ........................ 10-2010-0066515

(51) Int. Cl.
*G11C 7/10* (2006.01)
(52) U.S. Cl.
USPC ............................... 365/189.011; 365/189.15
(58) Field of Classification Search
USPC .................... 365/189.011, 189.15, 189.16
See application file for complete search history.

(56) References Cited

U.S. PATENT DOCUMENTS

| 7,885,137 B2 * | 2/2011 | Joo ........................ 365/230.03 |
| 2005/0078519 A1 * | 4/2005 | Shiga ...................... 365/185.17 |
| 2010/0135081 A1 * | 6/2010 | Kawamura et al. ...... 365/185.18 |

* cited by examiner

*Primary Examiner* — Vu Le
(74) *Attorney, Agent, or Firm* — William Park & Associates Patent Ltd.

(57) ABSTRACT

A semiconductor memory device includes a data coding logic for generating converted data groups and a inverted flag data from original data groups received by the semiconductor memory device. The number of zeros in the converted data groups is less than or equal to the number of zeros in the original data groups. The semiconductor memory device also includes data decoding logic for generating the original data groups from the converted data groups and the inverted flag data. A peripheral circuit may be enabled to program the converted data groups and the inverted flag data into the memory cells and read the converted data groups and the inverted flag data from the memory cells. A control logic may be enabled to generate control signals for the data coding logic, the data decoding logic, and the peripheral circuit.

18 Claims, 4 Drawing Sheets

FIG. 3A

| First data group (150) 10010110 | Second data group (162) 10100010 | Third data group (164) 10100100 | Fourth data group (150) 10010110 | Fifth data group (151) 10010111 | Original data |

FIG. 3B

| First data group (150) 10010110 | Second data group (162) 10100010 | Third data group (164) 10100100 | Fourth data group (150) 10010110 | Fifth data group (151) 10010111 | Original data |
| (150) 10010110 | (12) 00001100 | (2) 00000010 | (-14) 11110010 | (1) 00000001 | Pre-delta data or post-delta data |

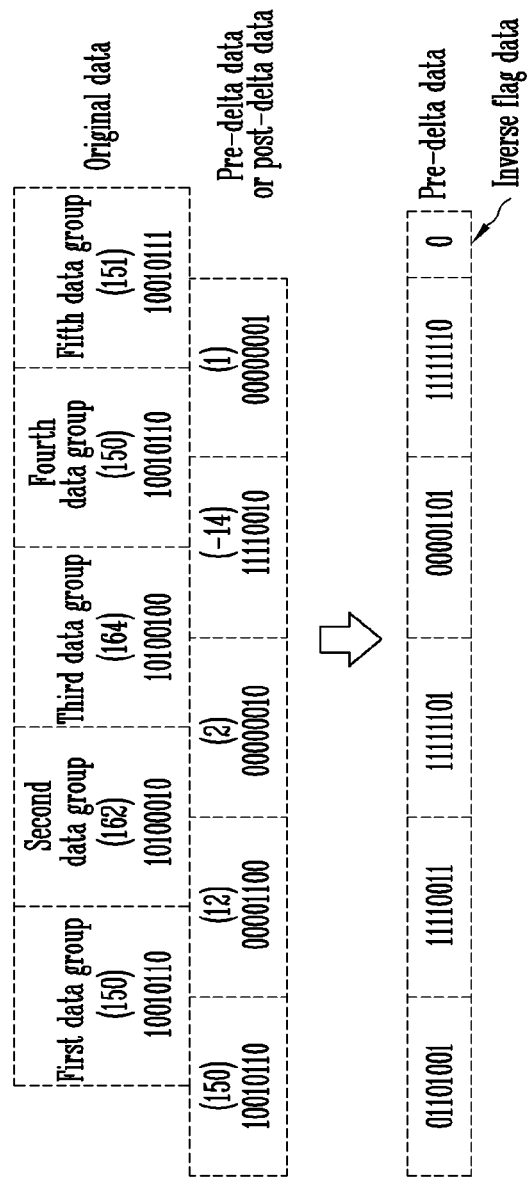

SEMICONDUCTOR MEMORY DEVICE AND METHOD OF OPERATING THE SAME

CROSS-REFERENCE TO RELATED APPLICATION

Priority is claimed to Korean patent application number 10-2010-0066515 filed on Jul. 9, 2010, the entire disclosure of which is incorporated by reference herein.

BACKGROUND

Exemplary embodiments relate to a semiconductor memory device and a method of programming the same.

There is an increasing demand for nonvolatile memory devices which can be electrically programmed and erased and can retain its data while power is off. In order to develop high-capacity memory devices capable of storing a large amount of data, techniques for high integration of memory cells are being developed. A nonvolatile memory device includes a plurality of memory cells coupled in series to form a cell string. A plurality of cell strings forms a memory cell array.

The string of the nonvolatile memory device has a structure in which the plurality of memory cells is coupled in series between a bit line and a source line. Due to this string structure, the number of contacts of the bit line and the source line is reduced and the size of the memory cell can be reduced, thereby being capable of implementing high-capacity memory. However, when the size of the memory cell is reduced, there is a disadvantage in that the access speed is slow because the cell current of the memory cell is very small.

In this nonvolatile memory device, one memory cell can store data of 2 bits or more in a multi-level form, unlike a typical memory device. That is, the memory cell can store data of several states by having different threshold voltage through control of the amount of electric charge charged in the floating gate of the memory cell. This multi-level cell program method is being widely used because it can significantly increase the capacity of the memory cell. In the multi-level cell program method, data of two or more logical pages is programmed into one physical page. When data of several logical pages is programmed into one physical page, the time that it takes to perform a program operation is long and a process of performing the program operation is complicated. Furthermore, the width between threshold voltage distributions is narrowed because the number of the threshold voltage distributions is increased. Accordingly, there are problems in that there is a difficulty in reading data because of a reduced read margin, and an interference phenomenon in which neighboring memory cells influence each other during a program operation.

BRIEF SUMMARY

Exemplary embodiments relate to a semiconductor memory device and a method of operating the same, which are capable of reducing the number of memory cells on which programming will be performed and of reducing interference, by converting data to be programmed in a selected page.

A semiconductor memory device includes a data coding logic for generating converted data groups and an inverted flag data from original data groups received by the semiconductor memory device. The number of program bits in the converted data groups is less than or equal to the number of program bits in the original data groups, wherein a program bit indicates that a bit in a memory cell is programmed from a logic one to a logic zero. The semiconductor memory device also includes data decoding logic for generating the original data groups from the converted data groups and the inverted flag data. A peripheral circuit may be enabled to program the converted data groups and the inverted flag data into the memory cells and read the converted data groups and the inverted flag data from the memory cells. A control logic may be enabled to generate control signals for the data coding logic, the data decoding logic, and the peripheral circuit.

A method of programming data in a semiconductor memory device may comprise receiving original data groups to be programmed into the semiconductor memory device. One or more reference data groups may be generated from corresponding original data groups wherein a value of the reference data group is the same as a value of the corresponding original data group. One or more non-reference data groups is generated by subtracting from a corresponding original data group an original data group previous to the corresponding original data group. A count is made of the number of bits in the reference and non-reference data groups that are at a logic level that correspond to a program state during programming of memory cells of a selected page.

If the number of counted bits is greater than a set number, converted data groups are generated by inverting each bit of the reference and non-reference data groups. An inverted flag data in an asserted state is also generated. Otherwise, converted data groups that are equal to the reference and non-reference data groups are generated, along with the inverted flag data in an unasserted state. The converted data groups and the inverted flag data are then programmed in to the selected page.

A method of reading from a semiconductor memory device may include reading delta data groups and inverted flag data from a selected page. If the inverted flag data is asserted, post-delta data groups may be generated by inverting the delta data groups. Otherwise, the post-delta data groups are the same as the delta data groups. A first original data group may be generated from a corresponding pre-determined post-delta data group that belongs to a first set of post-delta data group, where a value of the first original data group is the same as a value of the corresponding pre-determined post-delta data group. A second original data group may be generated by adding to a corresponding post-delta data group, which belongs to a second set of post-delta data group, a post-delta data group that is previous to the corresponding post-delta data group. The first and second original data groups may then be output by the semiconductor memory device.

BRIEF DESCRIPTION OF THE DRAWINGS

FIGS. 3A to 3C show data groups for illustrating a data conversion process according to an exemplary embodiment of this disclosure.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
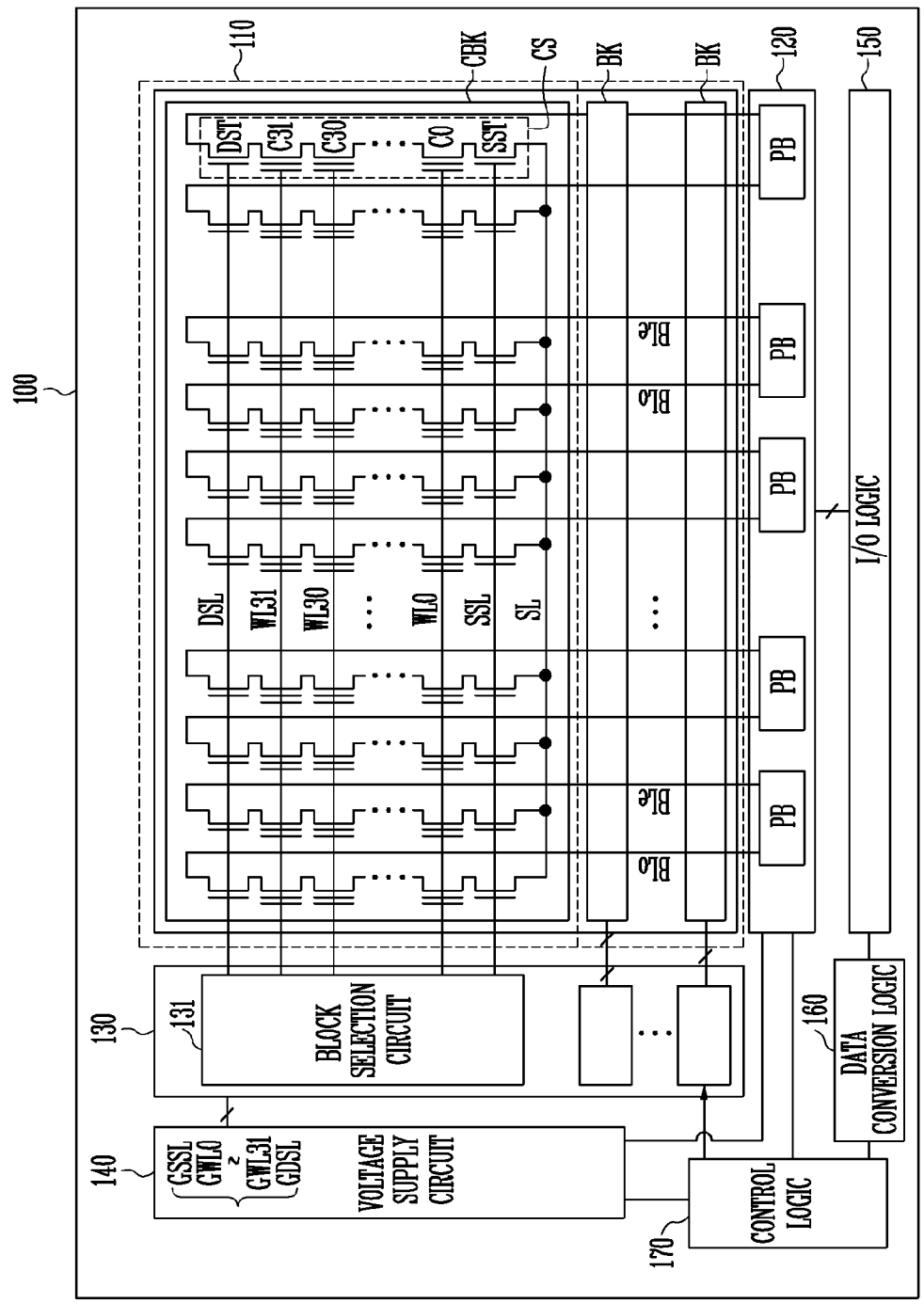
FIG. 1 shows a semiconductor memory device according to an exemplary embodiment of this disclosure.

FIG. 1 shows a semiconductor memory device according to an exemplary embodiment of this disclosure.

Referring to FIG. 1, the semiconductor memory device 100 includes a memory cell array 110, a page buffer group 120, an X decoder 130, a voltage supply circuit 140, an I/O logic 150, a data conversion logic 160, and a control logic 170.

The memory cell array 100 includes a plurality of memory blocks BK. Each of the memory blocks BK includes a plurality of cell strings CS.

Each of the cell strings CS includes $0^{th}$ to $31^{st}$ memory cells C0 to C31 coupled in series between a drain select transistor DST and a source select transistor SST.

The gates of the drain select transistors DST are coupled to a drain select line DSL, and the gates of the source select transistors SST are coupled to a source select line SSL.

The gates of the $0^{th}$ to $31^{st}$ memory cells C0 to C31 are coupled to respective $0^{th}$ to $31^{st}$ word lines WL0 to WL31.

The drains of the drain select transistors DST are coupled to respective bit lines. The bit lines are divided into an even bit line BLe and an odd bit line BLo.

The sources of the source select transistors SST are coupled to a common source line SL.

The page buffer group 120 includes a plurality of page buffers PB used for a program or read operation.

Each of the page buffers PB is coupled to a pair of the even bit line BLe and the odd bit line BLo.

The I/O logic 150 performs data input and output to and from the page buffer group 120 and the outside. In the semiconductor memory device 100 according to an exemplary embodiment of this disclosure, the I/O logic 150 is coupled to an external device (not shown) through eight I/Os.

Accordingly, data is inputted to and outputted from the external device 8 bits at a time.

The X decoder 130 includes a plurality of block selection circuits 131. The block selection circuits 131 are coupled to the respective memory blocks BK.

The block selection circuit 131 couples the drain select line DSL, the source select line SSL, and the $0^{th}$ to $31^{st}$ word lines WL0 to WL31 of the memory block BK to the global source select line GSSL, and the $0^{th}$ to $31^{st}$ global word lines GWL0 to GWL31 of the voltage supply circuit 140, respectively, in response to a control signal generated by the control logic 170.

The voltage supply circuit 140 generates operation voltages in response to the control signal of the control logic 170 and supplies the operation voltages to the global lines GSSL, GDSL, and GWL0 to GWL31.

The data conversion logic 160 converts data from devices (not shown) external to the semiconductor memory device 100 to appropriate format to be programmed in the semiconductor memory device 100, or converts programmed data in the semiconductor memory device 100 into appropriate format to be read by devices external to the semiconductor memory device 100. The data received by the semiconductor memory device 100 from external devices may be referred to as "original data." Additionally, "original data" may also refer to data output by the semiconductor memory device 100 to external devices.

The data converted by the data conversion logic 160 is stored in the page buffer group 120 and programmed into the memory cells.

Data read from the memory cells is stored in the page buffer group 120. The data conversion logic 160 converts the data stored in the page buffer group 120 into format of the original data and externally outputs the converted data through the I/O logic 150.

The control logic 170 generates control signals for controlling the operations of the page buffer group 120, the X decoder 130, the I/O logic 150, the voltage supply circuit 140, and the data conversion logic 160 of the semiconductor memory device 100.

Figure 2A:
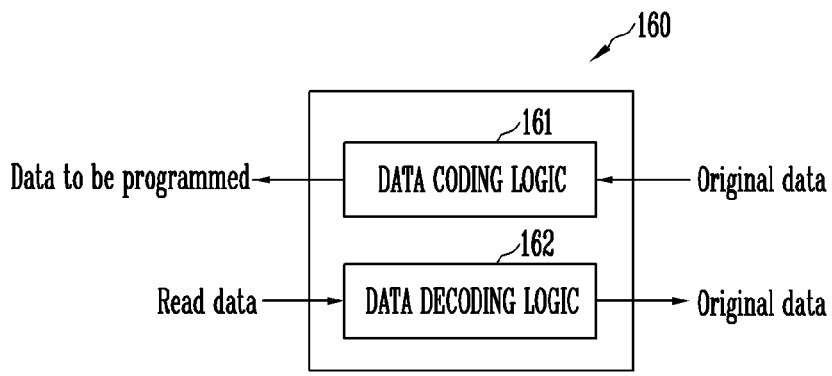
FIG. 2A is a detailed diagram showing a data conversion logic of FIG. 1.

FIG. 2A is a detailed diagram showing a data conversion logic of FIG. 1.

Referring to FIG. 2A, the data conversion logic 160 includes a data coding logic 161 and a data decoding logic 162.

The data coding logic 161 converts original data, received through the I/O logic 150, into desired data format for programming by coding the original data. The data decoding logic 162 converts data, read from a memory cell, into the original data format and outputs the converted data as original data.

The data coding logic 161 converts the original data into the data to be programmed by performing a delta operation for the original data and performing an inverting operation for the delta data according to a result of the delta operation. The data decoding logic 162 converts the data, read from a memory cell, into original data by inverting the read data according to whether the read data has been inverted and performing an operation opposite to the delta operation. Whether the read data has been inverted may be determined in response to inverted flag data which is stored when a result of the delta operation is inverted by the data coding logic 161.

In an embodiment of this disclosure, a subtraction operation is used as the delta operation. That is, a subtractor produces the delta data by performing the subtraction operation for data.

It has been described that the I/O logic 150 inputs and output data 8 bits at a time. Accordingly, the subtractor performs 8-bit subtraction operation.

The data coding logic 161 and the data decoding logic 162 will be described in more detail with reference to FIGS. 2B and 2C.

Figure 2B:
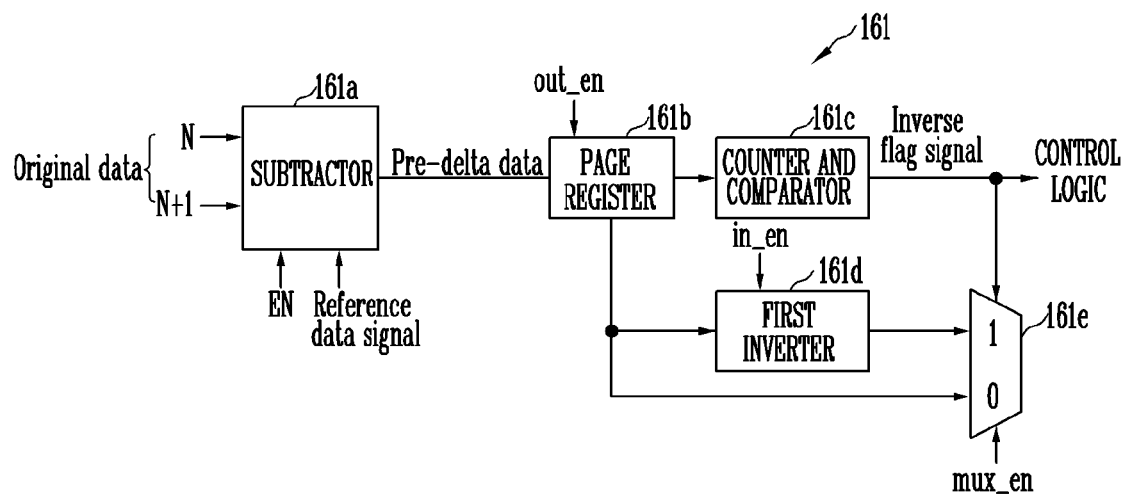
FIG. 2B is a detailed diagram showing a data coding logic of FIG. 2A.
Figure 2C:
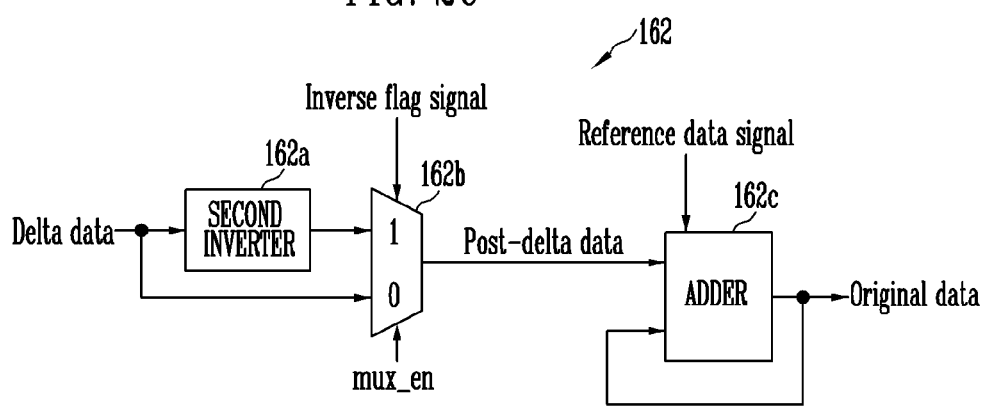
FIG. 2C is a detailed diagram showing a data decoding logic of FIG. 2A.

FIG. 2B is a detailed diagram showing the data coding logic of FIG. 2A, and FIG. 2C is a detailed diagram showing the data decoding logic of FIG. 2A.

FIGS. 3A to 3C show data groups for illustrating a data conversion process according to an exemplary embodiment of this disclosure.

FIGS. 2B and 2C will be described with reference to FIGS. 3A to 3C.

Referring to FIG. 2B, the data coding logic 161 includes a subtractor 161a, a page register 161b, a counter and comparator 161c, a first inverter 161d, and a MUX 161e.

The subtractor 161a outputs pre-delta data by performing a subtraction operation for 8-bit data.

In a method of the subtractor 161a performing the subtraction operation for the original 8-bit data, first received 8-bit data is subtracted from next received 8-bit data.

For two 8-bit data, the first received 8-bit data is defined as a first data group, and next received 8-bit data is defined as a second data group, the next 8-bit data is defined as a third data group, and so on.

In other words, 8-bit data received at an $N^{th}$ position becomes an $N^{th}$ data group, and 8-bit data received at an $(N+1)$ position becomes an $(N+1)^{th}$ data group.

The subtractor 161a subtracts the $N^{th}$ data group from the $(N+1)^{th}$ data group. In an embodiment of the invention, the first data group is defined as reference data where a subtraction operation is not performed on the reference data.

For example, as shown in FIG. 3A, original data to be programmed into one page of the semiconductor memory device 100 may include a first data group '1001 0110', a second data group '1010 0010', a third data group '1010 0100', a fourth data group '1001 0110', and a fifth data group '1001 0111'. A real page consists of many more data groups, but only the five data groups are illustrated for convenience of description.

In each data group, a number shown in parentheses indicates a decimal number.

As shown in FIG. 3C, the subtractor 161*a* performs the subtraction operation of subtracting the $N^{th}$ data group from the $(N+1)^{th}$ data group.

As stated previously, reference data may be a first data group of a page, or reference data may be set periodically in a page. For example, every $M^{th}$ data group may be reference data. When the reference data is inputted, the control logic 170 generates a reference data signal so that the subtractor 161*a* outputs the reference data without change.

In response to the reference data signal of the control logic 170, the subtractor 161*a* does not perform a subtraction operation for a first received data group and a next received data group, but outputs the first received data group without change.

By increasing the number of reference data in a page, data decoding error may be reduced.

In an embodiment of this disclosure, the first data group is set as the reference data. The control logic 160 performs control so that the first data group (that is, reference data) is stored in the page buffer group 120 and also provided to the data coding logic 161 without change.

Accordingly, the subtractor 161*a* outputs the first data group as a first pre-delta data group.

When the second data group is received, the subtractor 161*a* outputs a second pre-delta data group of '0000 1100' by subtracting the first data group from the second data group.

The subtractor 161*a* outputs a third pre-delta data group of '0000 0010' by subtracting the second data group from the third data group.

The subtractor 161*a* outputs a fourth pre-delta data group '1111 0010' by subtracting the third data group from the fourth data group and only keeping the least significant 8 bits without converting to a 2's complement format. Accordingly, a result of the third data group subtracted from the fourth data group is '1111 0010'.

A fifth pre-delta data group in which the fourth data group is subtracted from the fifth data group is '0000 00001'.

Data subtracted and outputted by the subtractor 161*a* as described above is the pre-delta data shown in FIG. 3C. That is, the subtractor 161*a* produces a $(k+1)^{th}$ pre-delta data group by subtracting a $k^{th}$ original data group from a $(k+1)^{th}$ original data group.

The first to fifth pre-delta data groups generated by the subtractor 161*a* through the subtraction operations are sequentially stored in the page register 161*b*. After all the pre-delta data groups are stored, the control logic 170 inputs an output enable signal out_en to the page register 161*b*.

In response to the output enable signal out_en of the control logic 170, the page register 161*b* outputs the first to fifth pre-delta data groups to the counter and comparator 161*c*.

The counter and comparator 161*c* counts a number '0' in the first to fifth pre-delta data groups outputted from the page register 161*b*. After all the pre-delta data groups are received, the counter and comparator 161*c* compares the number of counted numbers 0 with a set value.

The set value is set to limit the number of 0s in one page, and it corresponds to half the number of data bits in one page.

Accordingly, in this example where there are five data groups, or 40 bits, in a page, the set value is 20.

The count of zeros is compared with the set value 20. If the number of 0s is greater than 20, the counter and comparator 161*c* outputs an inverse flag signal of a high level. If the number of 0s is smaller than 20, the counter and comparator 161*c* outputs the inverse flag signal of a low level.

The counter and comparator 161*c* also inputs the inverse flag signal to the control logic 170. When the inverse flag signal of a high level is received, the control logic 170 sets the inverse flag data to '0'. The inverse flag data is stored in the flag cell of a page in which delta data changed from original data is stored. The inverse flag data indicates whether data stored in a specific page is inverted data.

When the inverse flag signal is received, the control logic 170 inputs the output enable signal out_en to the page register 161*b* again and also inputs enable signals in_en and mux_en to the first inverter 161*d* and the MUX 161*e*.

In response to the output enable signal out_en, the page register 161*b* outputs the first to fifth pre-delta data groups stored therein. The pre-delta data groups outputted from the page register 161*b* are inputted to the first inverter 161*d*.

Furthermore, the first to fifth pre-delta data groups outputted from the page register 161*b* are inputted to the second terminal 0 of the MUX 161*e*.

In response to the enable signal in_en, the first inverter 161*d* inverts the first to fifth pre-delta data groups of the page register 161*d* and inputs inverted results to the first terminal 1 of the MUX 161*e*.

The MUX 161*e* is operated in response to the enable signal mux_en. When the inverse flag signal of a high level is received, the MUX 161*e* outputs first to fifth pre-delta data groups inverted from the first to fifth pre-delta data groups, received from the first inverter 161*d* through the first terminal 1.

When the inverse flag signal of a low level is received, the MUX 161*e* outputs the first to fifth pre-delta data groups of the page register 161*b* received through the second terminal 0. The outputs of the MUX 161*e* become the first to fifth delta data groups.

The first to fifth delta data groups are sent to the page buffer group 120.

The first to fifth delta data groups of the MUX 161*e* and the inverse flag data set by the control logic 170 are stored in the page buffer group 120. The first to fifth delta data groups and the inverse flag data are programmed into a selected page.

A program operation is the same as the program operation of a common semiconductor memory device, and so a detailed description thereof is omitted.

The data decoding logic 162 of FIG. 2C is operated in order to read the first to fifth delta data groups, programmed as described above, and output them as first to fifth original data groups.

Referring to FIG. 2C, the data decoding logic 162 includes a second inverter 162*a*, a MUX 162*b*, and an adder 162*c*.

The second inverter 162*a* inverts the first to fifth delta data groups received from the page buffer group 120 and outputs the inverted results. The outputs of the second inverter 162*a* are inputted to the first terminal 1 of the MUX 162*b*. Data outputted from the page buffer group 120 is provided in the unit of first to eighth delta data groups having the unit of 8 bits.

Accordingly, the second inverter 162*a* inverts data in the unit of 8 bits, and the MUX 162*b* outputs data in the unit of 8 bits.

The first to fifth delta data groups having the unit of 8 bits, received from the page buffer group 120, are also inputted to the second terminal 0 of the MUX 162b.

The control logic 170 checks inverted flag data from among read data and outputs the inverted flag signal to the MUX 162b. When the inverted flag data is '0', the control logic 170 outputs the inverted flag signal of a high level. When the inverted flag data is '1', the control logic 170 outputs the inverted flag signal of a low level.

When the inverted flag signal of a high level is received, the MUX 162b outputs data received through the first terminal 1. When the inverted flag signal of a low level is received, the MUX 162b outputs data received through the second terminal 0.

The data outputted from the MUX 162b is first to fifth post-delta data groups.

When the first post-delta data group first outputted is inputted to the adder 162c, the control logic 170 inputs the reference data signal. Since the first 8 bits has been set as the reference data, the control logic 170 inputs the reference data signal to the adder 162c, indicating that the first data of 8 bits is reference data.

When the reference data signal is received from the control logic 170, the adder 162c outputs the first post-delta data group of the MUX 162b without change. The data outputted from the adder 162c is original data. The first post-delta data group becomes the first data group (that is, original data).

The control logic 170 disables the reference data signal when the second post-delta data group is received.

Thus, the adder 162c adds the first group data, previously outputted, and the second post-delta data group now received and outputs the addition result as second group data.

That is, $(k+1)^{th}$ group data, outputted from the adder 162c, and $k^{th}$ post-delta data are added to produce $(k+1)^{th}$ group data.

If the delta data has a negative number, the adder 162c selects only lower 8 bits from among the added data as data groups and outputs the selected data groups. That is, the original data is restored by performing an opposite operation to that of the subtractor 161a shown in FIG. 2B.

In this example, the original data is the first data group '1001 0110', the second data group '1010 0010', the third data group '1010 0100', the fourth data group '1001 0110', and the fifth data group '1001 0111'. This original data is converted to the pre-delta data of '1001 0110' for the first data group, '0000 1100' for the second data group, '0000 0010' for the third data group, '1111 0100' for the fourth data group, and '0000 0001' for the fifth data group. The count of zeros for the five data groups is 27. Accordingly, the bits in the data group will be inverted and the inverse flag data will be set to a low state. The five data groups to be programmed will be '0110 1001', '1111 0011', '1111 1101', '0000 1101', and '1111 1110'. Since the five data groups have been inverted, a '0' will be written for the corresponding inverse flag data for the page.

When the programmed data is read, these five data groups will be read from the memory cells and converted as described previously. The '0' inverse flag data indicates that the five data groups have been inverted. Accordingly, the five data groups read from the memory cells will be inverted again. This recovers the original pre-delta data of '1001 0110' for the first data group, '0000 1100' for the second data group, '0000 0010' for the third data group, '1111 0100' for the fourth data group, and '0000 0001' for the fifth data group. These five data groups are output as post-delta data. By appropriate addition, the original data of the first data group '1001 0110', the second data group '1010 0010', the third data group '1010 0100', the fourth data group '1001 0110', and the fifth data group '1001 0111' are recovered.

The original data can now be outputted to the external device through the I/O logic 150.

The number of 0s programmed through the above data coding and decoding operations can be reduced, sometimes by a factor of two or more. Accordingly, interference between memory cells can be reduced, and original data first inputted can be normally outputted as output data.

The semiconductor memory device and the method of operating the same according to the exemplary embodiments of this disclosure can reduce interference between memory cells by reducing the number of data for moving the threshold voltages of memory cells, from among data to be programmed.

While various embodiments of the invention described selectively inverting bits by use of an inverter and a multiplexer in series, the invention need not be so limited. For example, an exclusive-OR with inputs A and B will invert the input A if the input B is a logical '1' and the input A will not be inverted if the input B is a logical '0'. Accordingly, this type of circuitry may be used to selective invert data by the data coding logic 161 and the data decoding logic 162. Various circuitry may be used in series or parallel as appropriate. Additionally, various circuitry may use combinational and/or sequential logic/circuitry.

What is claimed is:

1. A semiconductor memory device, comprising:
   a data coding logic configured to generate converted data groups and inverted flag data from original data groups by performing a delta operation wherein a number of program bits in the converted data groups is less than or equal to a number of program bits in the original data groups, wherein a program bit indicates that a bit in a memory cell is programmed from a logic one to a logic zero;
   a data decoding logic configured to generate the original data groups from the converted data groups and the inverted flag data;
   a peripheral circuit configured to program the converted data groups and the inverted flag data into the memory cells and read the converted data groups and the inverted flag data from the memory cells; and
   a control logic configured to generate control signals for the data coding logic, the data decoding logic, and the peripheral circuit.

2. The semiconductor memory device of claim 1, wherein the data coding logic comprises:
   a subtraction circuit configured to generate a pre-delta data group by subtracting from a corresponding original data group an original data group previous to the corresponding original data group;
   a counter configured to count the number of program bits in the pre-delta groups, and assert the inverted flag signal according to a result of the count; and
   an inverter logic configured to output as the converted data groups inverted pre-delta data groups when the inverted flag signal is asserted and non-inverted pre-delta data groups when the inverted flag signal is not asserted.

3. The semiconductor memory device of claim 2, wherein the data coding logic comprises a page register configured to temporarily store the pre-delta data groups.

4. The semiconductor memory device of claim 2, wherein the inverter logic comprises:
   an inverter circuit configured to invert the pre-delta data groups; and a multiplexer configured to select one of the pre-delta data groups and the inverted pre-delta data groups in response to the inverted flag signal as the converted data groups.

5. The semiconductor memory device of claim 4, wherein the multiplexer outputs the inverted pre-delta data groups when the inverted flag signal is asserted.

6. The semiconductor memory device of claim 2, wherein the subtraction circuit is configured to output the original data group without performing a subtraction operation for the original data group, in response to a reference data signal from the control logic.

7. The semiconductor memory device of claim 2, wherein the data coding logic comprises a comparison unit configured to assert the inverted flag signal when the number of counted program bits is greater than a set number.

8. The semiconductor memory device of claim 1, wherein the data decoding logic comprises:
an inverter logic configured to output as the post-delta data groups inverted converted data groups when the inverted flag signal is asserted and non-inverted converted data groups when the inverted flag signal is not asserted; and
an addition circuit configured to generate an original data group by adding to a corresponding post-delta data group a previous post-delta data group.

9. The semiconductor memory device of claim 8, wherein the inverter logic comprises:
an inverter circuit configured to invert the converted data groups read from the memory cells; and
a multiplexer configured to select one of the converted data groups and the inverted converted data groups, outputted by the inverter circuit, in response to the inverted flag data read from the memory cells, and the multiplexer outputting the selected data as post-delta data groups.

10. The semiconductor memory device of claim 8, wherein the addition circuit is configured to output the post-delta data group without performing an addition operation in response to a reference data signal from the control logic.

11. The method of claim 1, wherein each of the converted data group and the original data group comprises eight bits.

12. A method of programming data in a semiconductor memory device, comprising:
receiving original data groups to be programmed into a selected page;
generating a reference data group from a corresponding original data group wherein a value of the reference data group is the same as a value of the corresponding original data group;
generating a non-reference data group by subtracting from a corresponding original data group an original data group previous to the corresponding original data group;
counting a number of bits in the reference and non-reference data groups that are at a logic level that corresponds to an program state during programming of memory cells of the selected page;
generating, if the number of counted bits is greater than a set number, converted data groups by inverting each bit of the reference and non-reference data groups, and an inverted flag data in an asserted state;
generating, if the number of counted bits is not greater than the set number, converted data groups that are the same as the reference and non-reference data groups, and the inverted flag data in an unasserted state; and
programming the converted data groups and the inverted flag data into the selected page.

13. The method of claim 12, wherein the first original data group corresponds to a reference data group.

14. The method of claim 13, wherein there are a plurality of reference data groups.

15. The method of claim 12, wherein each of the reference data group, non-reference data group, the converted data group, and the original data group comprises eight bits.

16. A method of operating a semiconductor memory device, comprising:
reading delta data groups and inverted flag data from a selected page;
generating post-delta data groups by inverting the delta data groups if the inverted flag data is asserted, and not inverting the delta data groups if the inverted flag data is not asserted;
generating a first original data group from a corresponding pre-determined post-delta data group that belongs to a first set of post-delta data group, wherein a value of the first original data group is the same as a value of the corresponding pre-determined post-delta data group;
generating a second original data group by adding to a corresponding post-delta data group, which belongs to a second set of post-delta data group, a post-delta data group that is previous to the corresponding post-delta data group; and
outputting the original data groups.

17. The method of claim 16, wherein the first set of post-delta data group comprises a plurality of post-delta data groups.

18. The method of claim 16, wherein each of the delta data group, the post-delta data group, and the original data group comprises eight bits.

* * * * *